United States Patent [19]

Embree et al.

[11] Patent Number: 4,887,053
[45] Date of Patent: Dec. 12, 1989

[54] HIGH FREQUENCY VLSI OSCILLATOR

[75] Inventors: David M. Embree, Hampstead, N.H.; Shawn M. Logan, Andover, Mass.

[73] Assignees: American Telephone and Telegraph Company, New York, N.Y.; AT&T Bell Laboratories, Murray Hill, N.J.

[21] Appl. No.: 266,686

[22] Filed: Nov. 7, 1988

Related U.S. Application Data

[63] Continuation-in-part of Ser. No. 126,131, Nov. 27, 1987.

[51] Int. Cl.[4] .............................................. H03B 5/36
[52] U.S. Cl. ........................... 331/116 FE; 331/108 A
[58] Field of Search ........ 331/108 A, 108 R, 116 FE, 331/116 R, 117 FE, 117 R; 307/297; 330/85, 277, 300, 311

[56] References Cited

U.S. PATENT DOCUMENTS

| | | | |
|---|---|---|---|
| 4,388,536 | 6/1983 | Peil et al. | 331/116 FE |
| 4,400,812 | 8/1983 | Clark et al. | 372/29 |
| 4,405,906 | 9/1983 | Luscher | 331/116 FE |
| 4,700,125 | 10/1987 | Takata et al. | 323/317 |

Primary Examiner—Eugene R. La Roche
Assistant Examiner—Robert J. Pascal
Attorney, Agent, or Firm—Joseph A. Cameron

[57] ABSTRACT

Maximum frequency range in a VLSI voltage controllable crystal oscillator is obtained with a two-stage amplifier with feedback across both stages. The first stage is implemented by an MOS transistor connected in source-follower configuration to minimize input capacitance, and the second stage is implemented by a bipolar transistor to provide the needed gain. A bidirectional voltage limiter connected to a crystal node limits the oscillations to a symmetrical waveform. The bias of an output buffer amplifier may be selectively shifted to maintain optimum duty cycle with the different triggering levels of diverse logic driven by the oscillator, and the bias may be dynamically driven by an analog signal to provide a duty cycle-modulated output.

7 Claims, 1 Drawing Sheet

HIGH FREQUENCY VLSI OSCILLATOR

This application is a continuation-in part of application Ser. No. 126,131, filed Nov. 27, 1987, entitled "High Frequency CMOS Oscillator".

TECHNICAL FIELD

This invention is in the field of mini electronic oscillators.

BACKGROUND OF THE INVENTION

Digital communication relies on accurate timing; in this age of high bit rate digital communication, there is a large need for high frequency oscillators to time the high speed digital circuits. Furthermore, because of the degree of miniaturization prevalent in the industry, the need is particularly great for miniature oscillators manufacturable in low cost, very large scale integrated technology (VLSI) such as metal oxide semiconductor (MOS).

For the required accuracy to keep communication circuits synchronized, the oscillators may be controlled by a high Q resonator, common resonators include L-C tank circuits, tuned cavities, quartz crystals, and ceramic resonators. When a voltage controllable oscillator using a high Q resonator is used in a phase locked loop to match one frequency with another, its frequency must be variable over a reasonable range. This combination of requirements has proven hard to meet at low cost. The highest frequency at which an oscillator will operate is limited by the gain of the oscillator transistor; likewise, the frequency range through which an oscillator can be pulled is also limited by its gain. Unfortunately, the gain of semiconductor transistors manufactured in MOS is low compared, for example, to that of similar size transistors in bipolar technology. When the width to length ratio of an MOS transistor is increased to increase the gain, however, the gate-source and gate-drain capacitances of the transistor also increase. The resulting increased loading of the oscillator circuit offsets the increase in gain to result in only a small increase in maximum operating frequency, with substantial added current drain. Significant further reduction in effective gain of MOS transistors is caused by the body effect. Until our invention, therefore, the frequency range of mini oscillators in available VLSI technology has been severely limited.

An object of this invention is a mini oscillator that is manufacturable in VLSI technology and that has a significantly improved frequency range and a high pull range.

When oscillators are used in timing applications for digital circuits, a square wave with a duty cycle close to 50% is desirable to allow equal time for circuit action triggered by either the rising or the falling pulse edge. When oscillators are operated near their maximum frequency, however, the duty cycle is controlled by transistor parameters that tend to be asymmetrical. Conventional feedback circuitry may be used to force the duty cycle to 50%, but this can severely limit the oscillator frequency and is often a source of additional phase noise.

The duty cycle of an oscillator circuit embodying this invention can be readily controlled to approximately 50% without substantially limiting the maximum frequency of oscillation, and can be proportionally varied by an external signal over a chosen, controlled range.

SUMMARY OF THE INVENTION

An electronic oscillator comprises two amplifying stages having respective transistors of opposite polarity and feedback from the output of the second stage to the input of the first stage. The first stage has an MOS transistor connected in source follower configuration; the second stage transistor has a substantially higher transconductance than that of the first stage transistor.

Approximately 50% duty cycle can be assured without substantial frequency reduction by a bidirectional voltage limiter connected to the resonator node to limit the oscillations to a symmetrical waveform, and capacitive coupling into a symmetrically biased amplifying stage.

Changes in duty cycle caused by the different triggering levels of diverse logic connected to the oscillator output can be compensated for by selectable shifts in bias to a buffer amplifier.

DETAILED DESCRIPTION

Figures 1, 2:
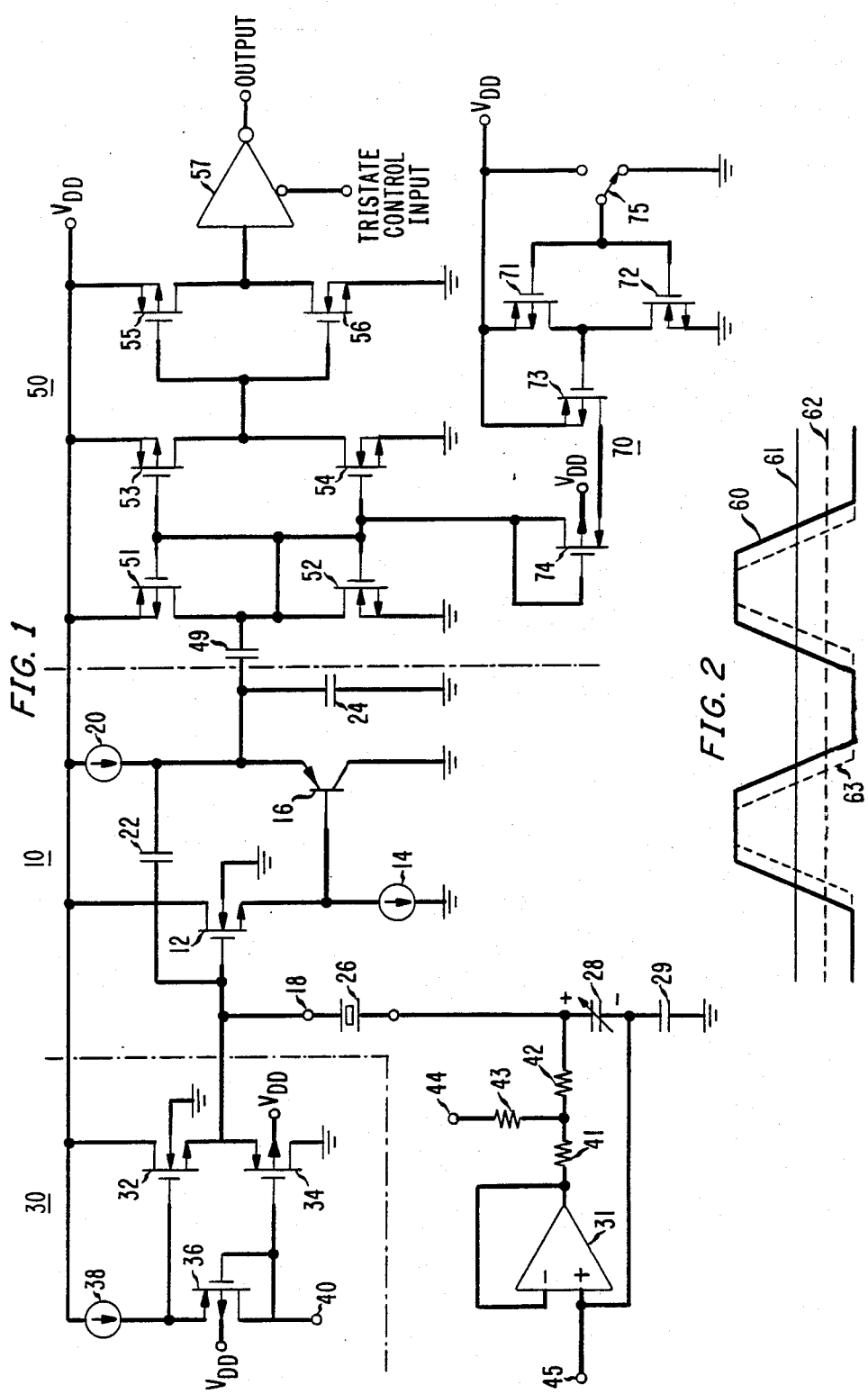
FIG. 1 is a schematic diagram of a voltage controllable crystal oscillator in CMOS technology that embodies the invention.
FIG. 2 is an output waveform useful in explaining a duty cycle control feature of the oscillator of FIG. 1.

For convenience, the oscillator of FIG. 1 may be considered in three sections—an oscillating section 10, a voltage limiting section 30, and an amplifying section 50.

In the oscillating section 10, an N-channel CMOS transistor 12 has its drain electrode connected to a source of operating voltage $V_{DD}$ and its source electrode connected through a current source 14 to ground. The gate electrode of transistor 12 is connected to a resonator node 18. A P-channel CMOS transistor 16 has its drain electrode connected to ground and its source electrode connected through a second current source 20 to source $V_{DD}$. A feedback capacitor 22 connects the gate of transistor 12 with the source electrode of transistor 16, and a second feedback capacitor 24 connects the source electrode of transistor 16 to ground.

The body of transistor 12 is connected to ground, while the body of transistor 16 is connected to its source electrode. To complete the oscillating section circuit, the series combination of a crystal resonator 26, a varactor 28 and a fixed capacitor 29 is connected between resonator node 18 and ground.

An oscillator may be considered an amplifier with feedback. The amplifier of oscillator section 10 is a two-stage amplifier including both transistors 12 and 16. Capacitors 22 and 24 provide the necessary feedback over both stages to sustain oscillations.

In accordance with the invention, transistor 12 is connected in a sourcefollower configuration. As a result, it has a very low input capacitance and a low voltage gain. It is of course known that low input circuit capacitance and high gain contribute to extending the frequency range of an oscillator. It will also be noted that the gate of transistor 12 is connected to ground via the series path of capacitors 22 and 24 and also via the series path of resonator 26, capacitor 28 and capacitor 29. One might therefore expect that the low input capacitance advantage to be gained by a first stage sourcefollower configuration would be lost in the input circuit capacitance and therefore more than offset by the ensuing loss in gain. We have found, however, that such is not the case. In fact, when the transistor width-to-length ratio of transistor 12 is made very low, the transconductance, or $g_m$, is lowered as well as the gate-to-source and gate-to-drain capacitance. The lower $g_m$ results in a slight lowering of stage gain, yet additional improvement in frequency range can be achieved because of expanded control of total resonator node capacitance.

Since the first transistor and amplifier stage are advantageously structured as a voltage follower, substantially the entire gain burden falls on the second stage. To satisfy this requirement in CMOS technology, transistor 16 may be a much larger transistor having a much larger width-to-length ratio.

In complementary metal oxide semiconductor (CMOS) construction many insulated gate transistors, of both P-channel and N-channel types, are formed in a semiconductor substrate by well known methods. For transistors of a channel type opposite to that of the substrate, the transistor body is usually the substrate. That is, for example, if the substrate is P-type silicon, N-type regions are formed in it to provide the source and drain, respectively, of an N-channel type transistor. The body of such transistors is the P-type substrate itself, which is generally connected to circuit ground. For transistors of a channel type the same as that of the substrate, on the other hand, a region of opposite type material, or "tub" is formed within the substrate to become the body of the transistor. For example, small P-type regions formed within a large N-type tub in a P-type substrate become the source and drain of a P-channel type transistor. The tubs are normally connected to the operating voltage source, $V_{DD}$.

The normal connection of substrate to ground and the tubs to the operating voltage source serves to reverse bias the source-body diode and allow the gate to control the source-drain impedance. It provides other effects, however, known as body effect which decreases the gain of the transistor and thus the frequency of the oscillator.

The oscillator of FIG. 1 overcomes this limitation.

The schematic diagram of FIG. 1 presumes a substrate of P-type semiconductor material, although the invention is not so limited.

It will be noted that while the body of transistor 12 is connected to ground in typical CMOS fashion, that of transistor 16 is connected to the source-electrode rather than $V_{DD}$. Since transistor 16 is formed in a tub, its body may be connected to its source as shown. This eliminates the body effect and its corresponding reduction in gain.

The CMOS amplifier of oscillating section 10 therefore has a small input capacitance contributed by the first stage and a large gain without significant body effect, contributed by the second stage. The optimum ratio of sizes of CMOS transistors depends, of course, upon the particular characteristics produced by the manufacturing process. We have found a ratio of 5:1 to operate very satisfactorily, yielding a maximum oscillating frequency of approximately 80 MHz. Current sources 14 and 20 are designed in accordance with standard CMOS procedure to maximize over-all amplifier gain.

It is important to note that while it is advantageous for the first stage transistor 12 to have the small size and high input impedance associated with CMOS or NMOS technology, the same is not true for the second stage transistor 16. The higher $g_m$ of other technologies such as, for example, bipolar, is indeed very useful in this application. For this reason, what is known as BIMOS technology, in which bipolar transistors are integrated on an MOS chip, is also very suitable for the oscillator of the invention. In BIMOS, the oscillator can be formed on one chip; the first stage transistor can be implemented in MOS for very low input capacitance, and the second stage transistor can be implemented in bipolar for high transconductance.

As previously mentioned, the embodiment of FIG. 1 is shown as a voltage-controllable crystal oscillator, although the invention is not limited thereto. Varactor control networks, useful to change the varactor capacitance and thereby the frequency for phase locked loop application are well known in the art. A typical such network might include a unity gain amplifier 31, a voltage divider comprising 3 resistors, 41, 42 and 43, and a source of reference voltage 44. The amplifier serves to buffer the control voltage applied to its input terminal 45. The reference voltage from source 44 and the voltage divider set the varactor voltage for maximum capacitance shift according to the varactor characteristic. Since no dc current flows in the circuit, the varactor voltage may be defined as $$V_{var} = \frac{R_{41}}{R_{41} + R_{43}} (V_{44} - V_{control})$$

where $V_{control}$ is the voltage applied to terminal 45, and $V_{44}$ is the reference voltage from source 44. Although varactors formed by other processes may be satisfactorily used to perform this invention, a particularly useful one is described in our copending application, Ser. No. 126,131, filed Nov. 27, 1987, titled "Voltage Controlled Variable Capacitor". It is manufacturable in CMOS and therefore may be integrated on the same chip for cost savings and optimal miniaturization.

Where fixed frequency operation is desired, resonator 26 may be connected between node 18 and either $V_{DD}$ or ground.

Normally, a resonator controlled oscillator without specialized resonator limiting means produces a non-sinusoidal waveform. The semiconductor transistors are driven between their linear regions and cutoff, and the output voltage may swing almost the full range of the supply voltage. Such operation generally results in a non-symmetrical output waveform that is not convenient for digital circuit timing purposes, as it is not controlled with respect to voltage, temperature, and device manufacturing variations.

In accordance with another aspect of the embodiment of FIG. 1, voltage limiting section 30 of the embodiment of FIG. 1 limits the excursions at resonator node 18 to keep transistors 12 and 16 in their saturated regions and provide a controlled symmetrical waveform.

In section 30, the drain-source path of an N-channel transistor 32 is connected in series with the source-drain path of a P-channel transistor 34 across the source of operating voltage $V_{DD}$. The source electrodes of transistors 32 and 34 are connected together and to resonator node 18. A diode-connected P-channel transistor 36 has its source electrode connected through a current source 38 to voltage source $V_{DD}$ and its drain and gate electrodes connected to a source of reference voltage 40. The gate electrode of transistor 34 is connected to voltage reference source 40, and the gate electrode of transistor 32 is connected to current source 38.

Operation of the limiter may be explained as follows:

Since the gate electrode of transistor 34 is connected to voltage reference source 40, and the source electrode is connected to resonator node 18, transistor 34 conducts whenever the voltage at node 18 is more than the threshold voltage above reference voltage 40. Similarly, transistor 32 conducts whenever the voltage at its source electrode is less than the threshold voltage below its gate voltage. Since forward biased diode 36 operates at a voltage approximately equal to the threshold voltage of transistor 32, transistor 32 conducts whenever the voltage at node 18 drops below approximately reference voltage 40. Since resonator 26 is quickly loaded by even small currents, the limiter restricts the voltage at node 18 to a minimum of the reference voltage and a maximum of the diode voltage greater than the reference voltage. This prevents both transistors 12 and 16 of the oscillator section from leaving the saturated mode of operation and thereby prevents discontinuities in the waveform and insures waveform symmetry and 50% duty cycle.

Voltage reference 40 is therefore chosen to set the quiescent voltage of node 18 and current source 38 to bias transistor 36 at a stable conducting point.

When a varactor is used to pull the oscillator frequency, voltage reference 40 may be derived from the varactor control voltage by well known voltage divider methods.

A low level CMOS oscillator needs amplification to provide a useful digital level output signal and buffering to prevent the load from affecting its operation. These are major functions of amplifying section 50 of the embodiment of FIG. 1. The particular design of section 50, however, can also preserve the symmetry of the waveform, and therefore the duty cycle, without sacrificing operating frequency.

Section 50 may advantageously comprise several pairs of complementary transistors, each pair having its source-drain paths connected in series across supply voltage $V_{DD}$, and forming an inverting amplifying stage. To preserve the 50% duty cycle generated by the symmetrical oscillation, however, the zero signal bias point for each stage must be approximately $V_{DD}/2$, and the threshold voltages must remain almost constant for each successive stage. Since the oscillating section output signal is connected via a coupling capacitor 49, the bias may be set initially by a first pair of complementary transistors 51 and 52 connected as diodes. The transistors are designed according to standard MOS practice to produce complementary characteristics. In order to maintain constant threshold voltages, each succeeding pair of complementary transistors, e.g., 53, 54 and 55, 56 must be closely matched to transistors 51 and 52, respectively. The matching is accomplished by using the same multiple of transistor width-to-length ratio for the transistors in each pair. That is, if the width-to-length ratio of transistor 53 is 10.6 times the width-to-length ratio of transistor 51, that of transistor 54 should be 10.6 times that of transistor 52, within a few percent. The same is true of each succeeding stage, although the ratio may be different for each stage. The number of amplifying stages may be chosen to suit the needs of the particular application. Additionally, they may terminate in a tristate output buffer 57 to allow the timing signal to be turned on and off without affecting the operation of the oscillating section.

To further enhance the embodiment of FIG. 1, a bias changing circuit 70 may be connected to the gates of transistors 53 and 54 to modulate the duty cycle and to supply an approximate 50% duty cycle timing waveform of loads of diverse logic types. When a symmetrical timing signal is operated at near maximum frequency into a load, the rise and fall times of the waveform may consume a considerable part of the cycle. The result is a trapezoidal waveform similar to solid curve 60 of FIG. 2. If the load happens to be a CMOS circuit, the load circuit triggering level would typically be approximately $V_{DD}/2$, shown at level 61 on FIG. 2. At this triggering level, it can be seen that the effective duty cycle of waveform 60 is indeed about 50%. If the load circuit is transistor-transistor logic (TTL), on the other hand, its triggering level is much lower, typically 1.4 volts. This level is represented by dotted line 62. It can be seen by the intersections of line 62 with waveform 60, that the effective duty cycle with a TTL load is far from 50%, and therefore not as useful. Bias shifting circuit 70 provides a switchable correction. Circuit 70 may comprise a first pair of complementary transistors 71 and 72 having their drains connected together and their drain-source paths connected between $V_{DD}$ and ground. A pair of P-channel transistors, 73 and 74 have their source-drain paths connected in series between $V_{DD}$ and the gates of transistors 53 and 54. Device 74 is diode-connected; the gate of transistor 73 is connected to the drains of transistors 71 and 72; and the gates of transistors 71 and 72 are connected through a switch 75 to $V_{DD}$ or ground.

Circuit 70 operates as follows:

When switch 75 is connected to ground, transistor 72 turns off, and transistor 71 turns on. This turns transistor 73 off, and the biasing of amplifying circuit 50 is unaffected. Waveform 60 is the effective output, ideal for a CMOS load. When switch 75 is connected to $V_{DD}$, on the other hand, transistor 71 turns off, and transistor 72 turns on. This turns on transistor 73, and the input dc voltage of amplifying section 50 is raised. With an overall inverting nature of the combination of amplifying and buffer stages, the output waveform is shifted to dwell longer near ground, as shown in dotted waveform 63 of FIG. 2. The intersections of dotted waveform 63 with dotted threshold level 62 show that a 50% duty cycle may be thus established for a TLL load. It is worth noting that bias shifting circuit 70 should be connected to an early amplifier stage where the oscillator signal still has appreciable rise and fall time; it would have much less effect on duty cycle at a near-square wave stage.

It should also be noted that an analog signal of appropriate amplitude injected into the gate of transistor 54 will provide an oscillator circuit output from buffer 57 whose duty cycle is modulated according to the analog signal. This analog signal has a threshold changing effect similar to that of bias shifting circuit 70. We have thus described a mini oscillator circuit, manufacturable in VLSI technology, that has a high frequency range at an approximate 50% duty cycle. Further, the duty cycle may be modulated by an analog signal or readily compensated for varying switching thresholds of differing logic types. It will be evident to those skilled in the art that many variations of the described circuit can be made without departing from the spirit or the scope of our invention.

We claim:

1. An electronic oscillator comprising;

a first amplifying stage having an MOS transistor connected in source follower configuration;

a second amplifying stage having a bipolar transistor of opposite polarity from said MOS transistor connected to said first amplifying stage; and feedback means connected between the output of said second stage and the input of said first stage;

the transconductance of said bipolar transistor being substantially greater than that of said MOS transistor.

2. An electronic oscillator, as in claim 1, wherein said second amplifying stage is also connected in source follower configuration.

3. An electronic oscillator, as in claim 1, wherein said MOS transistor and said bipolar transistor are on the same silicon chip.

4. An electronic oscillator, as in claim 1, further comprising a resonator node connected to said input of said MOS transistor for connection to a resonator to control the frequency of oscillation; and bidirectional voltage limiting means connected to said resonator node to provide waveform symmetry at said second amplifying stage.

5. An electronic oscillator, as in claim 4, further comprising buffer amplifier means capacitively coupled to at least one of said amplifying stages to provide an oscillator circuit output;

said buffer amplifier means having its zero-signal bias point substantially at its threshold voltage to preserve the waveform symmetry at said oscillator circuit output.

6. An electronic oscillator, as in claim 5, further comprising bias varying means connected to said buffer amplifier means for varying the buffer amplifier bias to correspondingly vary the duty cycle of said oscillator circuit output.

7. An electronic oscillator, as in claim 6, wherein said bias varying means selectively alters said buffer amplifier to compensate for a change in duty cycle caused by a change in the desired triggering level at said oscillator circuit output.

* * * * *